United States Patent [19]

Feldman et al.

[11] Patent Number: 4,626,103
[45] Date of Patent: Dec. 2, 1986

[54] FOCUS TRACKING SYSTEM

[75] Inventors: Martin Feldman, Berkeley Heights; David N. Reece, Irvington; John S. Wagner, Lebanon, all of N.J.

[73] Assignee: AT&T Bell Laboratories, Murray Hill, N.J.

[21] Appl. No.: 594,939

[22] Filed: Mar. 29, 1984

[51] Int. Cl.$^4$ ............................................. G01B 11/14
[52] U.S. Cl. .................................................. 356/363
[58] Field of Search ............... 356/351, 355, 356, 358, 356/359, 363, 354, 381, 383; 350/169

[56] References Cited

U.S. PATENT DOCUMENTS

| | | | |
|---|---|---|---|
| 3,819,265 | 6/1974 | Feldman et al. | 355/51 |
| 3,884,580 | 5/1975 | Webster et al. | 356/358 |
| 4,360,273 | 11/1982 | Thaxter | 356/354 |
| 4,395,123 | 7/1983 | Minott | 356/353 |
| 4,465,366 | 8/1984 | Schmidt | 356/356 |
| 4,498,771 | 2/1985 | Makosch et al. | 356/359 |

OTHER PUBLICATIONS

Jenkins and White, *Fundamentals of Optics*, pp. 241-243, (3d ed 1957).

Primary Examiner—Vincent P. McGraw
Assistant Examiner—S. A. Turner
Attorney, Agent, or Firm—Lester H. Birnbaum

[57] ABSTRACT

A method and apparatus are disclosed for tracking the position of surfaces during certain processing such as optical projection printing. Light from a line or point source is made incident on the surface at a small angle to produce interference fringes between the reflected light and a reference beam. Any movement of the surface causes a shifting of the fringe pattern which can be detected by appropriate means such as a slit or grating and photodiode combination.

16 Claims, 2 Drawing Figures

U.S. Patent        Dec. 2, 1986        4,626,103
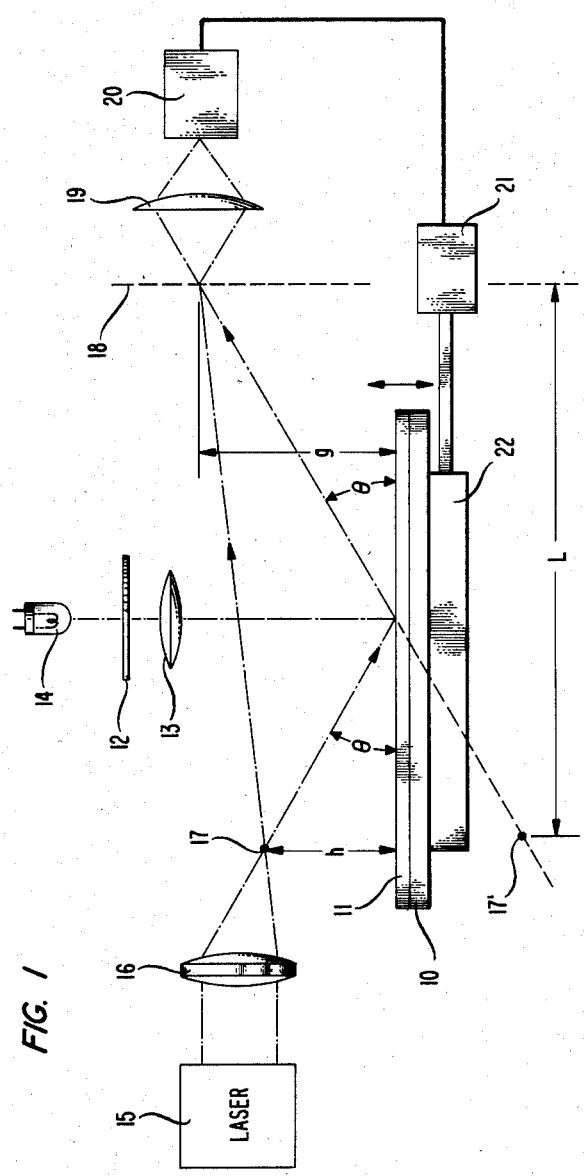
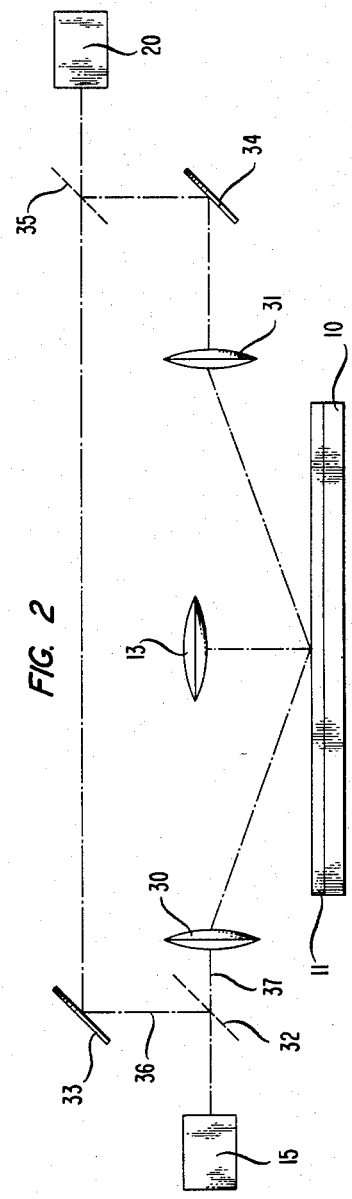

FOCUS TRACKING SYSTEM

BACKGROUND OF THE INVENTION

This invention relates to semiconductor integrated circuit fabrication, and in particular to a means of insuring proper focusing during optical projection printing or other processing of the semiconductor wafer.

With the desire for increasing circuit density in semiconductor IC fabrication, the need for fine-line circuit pattern generation has become acute. The typical method of generating patterns in the wafer involves forming a photoresist layer over a major surface of the wafer and exposing the layer to light through a mask. The photoresist is then developed to expose the wafer surface in the desired pattern. One generally accepted method of exposing the photoresist layer is optical projection printing where the mask is imaged onto the photoresist layer rather than being in direct contact therewith. Step and repeat printers and scanning printers, for example, provide this type of pattern generation. (For an example of the latter, see U.S. Pat. No. 3,819,265 issued to Feldman et al.)

In order to insure fine-line definition, it is usually necessary during projection printing to provide some means for monitoring the position of the wafer to insure that the mask is precisely focused onto the photoresist layer throughout the entire printing operation. A typical method of providing this focus tracking involves focusing laser light at a grazing angle to the photoresist layer and then imaging the reflected light onto a split photodiode. The position of the imaged light on the photodiode depends on the vertical position of the wafer, and movement of the light position generates signals which are coupled to means for adjusting the position of the wafer. (See, e.g., U.S. Pat. No. 3,819,265 cited above.)

While such focus tracking systems are generally adequate, accuracy can be affected by variations in reflectivity along the wafer surface due to differences in topography or other causes.

In addition to projection printing, other steps in semiconductor fabrication may require focus tracking. For example, it may be desirable to examine automatically a pattern on a wafer or mask to measure linewidth. Further, as an alternative to optical projection printing, an electron beam exposure system might be employed for pattern generation. Thus, focus tracking is desirable wherever a wafer or mask surface is required to be in a certain plane.

It is, therefore, an object of the invention to provide focus tracking of a semiconductor wafer or mask which provides high sensitivity so that an accurate measure of wafer or mask height is obtained, but which is relatively insensitive to variations in wafer or mask reflectivity.

SUMMARY OF THE INVENTION

This and other objects are achieved in accordance with the invention, which in one aspect is a method of fabricating integrated circuits in a semiconductor wafer including tracking the position of a surface relative to a desired plane. A light beam is directed at a small angle to the surface so as to specularly reflect at least a portion of the beam and form interference fringes from the reflected beam and a reference beam. Changes in the position of the fringes are detected and the position of the surface relative to the plane is adjusted in response to changes in the position of the fringes.

In accordance with another aspect, the invention is an apparatus including means for tracking the position of an object surface relative to a desired plane. The apparatus includes means for directing a light beam at a small angle to the object surface so as to reflect at least a portion of the beam and form interference fringes from the reflected beam and a reference beam. Means are provided for detecting changes in the position of the fringes and for adjusting the position of the object surface relative to the desired plane in response to changes in the position of the fringes.

BRIEF DESCRIPTION OF THE DRAWING

These and other features of the invention will be delineated in detail in the following description. In the drawing:

FIG. 1 is a schematic view of a focus tracking system in accordance with one embodiment of the invention; and FIG. 2 is a schematic view of a portion of a focus tracking system in accordance with a further embodiment of the invention.

It will be appreciated that, for purposes of illustration, these Figures are not necessarily drawn to scale.

DETAILED DESCRIPTION

The basic principles of the invention will now be described with reference to the embodiment illustrated schematically in FIG. 1. A semiconductor wafer, 10, is illustrated with a photoresist layer, 11, formed over one major surface. The wafer could also include topological features such as multilayers including patterned resist and metal layers, but a single resist layer is shown for the sake of clarity. It will be appreciated that the "wafer surface" in the context of this application is the top surface of the uppermost layer being printed.

As shown schematically, it is desired to generate a pattern from a mask, 12, on at least a portion of the photoresist layer, 11, by projecting actinic light from a source, 14, through the mask and focusing the light by some means, such as lens, 13, onto the wafer surface. To insure printing of adequate resolution, the irradiated area of the wafer surface should remain in the image plane of the lens, 13, to within a fairly tight tolerance (desirably within ±1 μm for many lenses available at present).

In order to insure that the mask pattern is properly focused, a second light source, in this example a laser, 15, is provided. This light source does not affect the exposure of the photoresist. The laser light is focused by cylindrical lens, 16, to a line source, one point of which is shown as 17. Alternatively, the light could be focused to a point source, or a collimated beam might be employed. Part of the light beam is directed at a small angle, θ, to the wafer surface. (The angle shown in the Figure is greatly exaggerated for the sake of illustration. Actual values of θ will usually be in the range 0.2 to 5 degrees.) This grazing incidence causes a portion of the laser beam to be specularly reflected by the wafer surface while a portion of the laser beam passes over the wafer and is not reflected. This essentially establishes a Lloyd's Mirror Interferometer with the focused line, 17, simulating a slit. Thus, a set of parallel interference fringes will be formed between the light coming directly from the source, 17, which is considered a reference beam, and the light reflected from the wafer surface which emanates from a virtual source, 17'. (See, e.g., Jenkins and White, *Fundamentals of Optics*, pp. 241–243 (3d Ed., 1957).)

It can be shown, using the small angle approximation to a double-slit geometry, that the fringe spacing is given by:

$$s = \frac{\lambda L}{2h} \quad (1)$$

where $\lambda$ is the wavelength of the light, L is the distance from the sources (17, 17') to the plane of the fringes and h is the vertical distance of the sources from the wafer surface.

In this example, a horizontally polarized He—Ne laser, 15, was utilized which emitted a beam with a wavelength of 6328 Å. L was approximately 12 cm and h was approximately 3 millimeters.

The fringes will have their highest contrast in the plane essentially perpendicular to the wafer surface where the central ray from the laser beam intersects the wafer surface. It is convenient, therefore, to provide some means of detecting the fringes at or near this plane. A single slit in front of a photodetector would serve to detect the fringes. In this example, however, the detection means included an 8.5 μm period Ronchi grating, 18, in the plane of highest contrast, a lens, 19, for focusing the fringe pattern, and a standard photodiode, 20, for converting the optical signal to an electrical signal. The electrical signal, in turn, can be coupled to some mechanical means, in this example a motor drive, 21, coupled to the table, 22, on which the wafer was mounted, in order to adjust the position of the wafer. For example, the motor, 21, could drive a standard worm gear configuration for moving the table, 22. Several other standard means are available to provide the necessary mechanical adjustment in response to the signal from photodetector, 20. The wafer could be positioned on a piezoelectric transducer coupled to the photodetector. Standard magnetic deflection systems might also be employed. Further, it may be desirable to provide means for moving the printer focusing components (lens 13) rather than the wafer in order to keep the wafer surface in the image plane.

In operation, to stabilize the focus on the wafer, the vertical distance, h, could be adjusted by moving lens, 16, so that the period of the fringes matched the period of the grating. If, at any time during the printing operation, the wafer should move out of the image plane, the fringe pattern will change as a result of the increase or decrease in path length of the reflected portion of the beam from laser, 15. That is, the position of the fringes in the plane of the grating, 18, will change, as well as the fringe spacing (from equation (1)). This will cause a change in the light intensity detected by photodiode, 20, which in turn produces a variation in the electrical signal to the mechanical means (21, 22) for adjusting the position of the wafer, in this example, in the vertical direction.

The light intensity detected, and therefore the photodiode output, will be a periodic function of wafer displacement due to the movement of the fringe pattern. It can be shown that the amount of wafer displacement, d, which will result in a fringe at a height, g, in the plane of the grating to be replaced by a fringe above or below it in the pattern is $$d = \frac{\lambda L}{2(g + h)} \quad (2)$$

It is generally desirable to achieve d within the range 2–100 μm. Smaller values tend to increase the risk of undetected fringe shifts, while larger values reduce the sensitivity.

Since the invention relies on interference effects rather than imaging, the focus tracking is relatively insensitive to local variations in reflectivity of the wafer surface. In this regard, it is generally desirable to provide a very small grazing angle to achieve a good reflection, and to focus the reflected beam from laser, 15, to cover a significant portion of the wafer surface (usually at least a few mm) so that the contribution to each fringe is spread out over a substantial area. While grazing angles of less than 5 degrees are preferred, angles as much as 30 degrees might be useful. Angles of less than 0.2 degrees are generally not desirable in order to keep the footprint of the beam within reasonable limits.

No differences in the brightness or contrast of the fringes were observed whether the substrate was glass, aluminum, chrome, patterned resist on bare silicon or patterned resist on patterned aluminum. Thus, virtually all smooth substrates would be sufficiently reflective at the low grazing angles utilized to produce a high signal-to-noise ratio. Wafer tilt would change the portion of the wafer contributing to the signal but would not affect the fringe positions. The optical signal is generally representative of the top surface of the wafer. If uneven topography is included in the portion of the wafer reflecting the beam, as in the case of thin resist over conductors and the like, the detected signal would give an average height.

As an alternative to the detection means described above, two adjacent Ronchi gratings which are 180 degrees out of phase might be employed along with a standard split photodiode. In such an example, the optics could be adjusted so that when the wafer surface was in the image plane, equal light would pass through each grating and be incident on the corresponding half of the photodiode. Whenever the surface moved out of the image plane, one-half of the photodiode would show an increase and the other half a decrease in light intensity, which could be translated into an appropriate mechanical adjustment. The system could, therefore, be made independent of variations in light intensity from source, 15, which would result in an increase or decrease in the signal from both halves of the photodiode.

It will also be realized that interference fringes might also be generated between the reflected beam and some reference beam which is not incident over the wafer, as shown schematically in FIG. 2, which shows a portion of the tracking system of FIG. 1 modified in accordance with this embodiment. Elements corresponding to those of FIG. 1 are similarly numbered. Here, light from the laser, 15, is divided into two beams, 36 and 37, by a standard beam splitter, 32. The reference beam, 36, is diverted from the wafer surface while the incident beam, 37, is directed through a focusing lens, 30, and reflected from the wafer surface. After reflection, the beam, 37, is collimated by lens, 31, and directed by mirror, 34, toward beam combiner, 35. In the meantime, reference beam, 36, is directed by mirror, 33, toward combiner, 35, so that the reflected and reference beams are combined and the interference fringes formed.

This particular embodiment is advantageous where it is desired to place lens, 13, close to the wafer surface, as when linewidths are examined. It will be appreciated that lenses, 30 and 31, serve to decrease the cross-sectional area of the beam, 37, when the lens, 13, is close to the wafer surface, and these lenses could be omitted for other applications.

Various additional modifications will become apparent to those skilled in the art. All such variations which basically rely on the teachings through which the invention has advanced the art are properly considered within the spirit and scope of the invention.

What is claimed is:

1. A method of fabricating integrated circuits in a semiconductor wafer including tracking the position of a surface relative to a desired plane comprising:
    directing a light beam at a small angle to the surface so as to specularly reflect a portion of the beam and form interference fringes between the reflected beam and the remaining portion of the beam passing over the surface;
    detecting changes in the position of the fringes; and
    adjusting the position of the surface relative to the plane in response to changes in the position of the fringes.

2. The method according to claim 1 wherein the light source for the beam is a laser.

3. The method according to claim 1 wherein the light beam is focused to a line prior to being directed to the surface.

4. The method according to claim 1 wherein the angle of the beam to the surface is less than 30 degrees.

5. The method according to claim 1 wherein changes in the position of the fringes are detected by positioning at least one grating in a plane essentially perpendicular to the surface and focusing the light passing through the grating onto a photodetector.

6. The method according to claim 1 wherein the surface is a wafer surface and a mask pattern is focused on the wafer surface and the wafer position is adjusted to keep the wafer surface in the image plane of the focused pattern.

7. A method of fabricating integrated circuits in a semiconductor wafer including maintaining the wafer surface in a desired image plane while focusing a mask pattern onto the wafer surface comprising:
    directing a light beam at an angle of less than 5 degrees to the wafer surface so as to reflect a portion of the beam and form interference fringes between the reflected beam and the remaining portion of the beam passing over the wafer surface;
    detecting changes in the position of the fringes by positioning at least one grating in a plane essentially perpendicular to the wafer surface and focusing the light passing through the grating onto a photodetector; and
    adjusting the position of the wafer surface relative to the image plane in response to variations in light intensity detected by the photodetector.

8. The method according to claim 1 or 7 wherein the position of the wafer is adjusted.

9. The method according to claim 1 or 7 wherein the position of the desired image plane is adjusted.

10. Apparatus including means for tracking the position of an object surface relative to a desired plane comprising:
    means for directing a light beam at a small angle to the surface of the object so as to specularly reflect a portion of the beam and form interference fringes between the reflected beam and the remaining portion of the beam passing over the surface;
    means for detecting changes in the position of the fringes; and
    means for adjusting the position of the object surface relative to the desired plane in response to changes in the position of the fringes.

11. Apparatus according to claim 10 wherein the light beam is provided by a laser.

12. Apparatus according to claim 10 wherein the means for directing the light beam includes means for focusing the beam to a line.

13. Apparatus according to claim 10 wherein the means for detecting changes in the position of the fringes comprises at least one grating positioned essentially perpendicular to the object surface and a photodetector positioned to receive light passing through the grating.

14. Apparatus according to claim 10 wherein the means for detecting changes in the position of the fringes comprises:
    two gratings positioned in a plane essentially perpendicular to the object surface and adjacent to each other so as to be approximately 180 degrees out of phase; and
    a split photodiode, each half of which is positioned to receive light passing through one of the gratings.

15. Apparatus according to claim 10 wherein the means for detecting the position of the fringes includes a photodetector, and the means for adjusting the object surface relative to the desired plane includes mechanical means coupled to the output of the photodetector so as to move the object in a direction essentially perpendicular to the direction of the light beam.

16. An optical projection printer for generating patterns in semiconductor wafers, including apparatus for maintaining the wafer surface in a desired image plane while focusing a mask pattern onto the wafer surface comprising:
    means for directing a light beam at a small angle to the wafer surface so as to reflect a portion of the beam and form interference fringes between the reflected portion and the remaining portion of the beam passing over the wafer surface;
    means for detecting changes in the position of the fringes comprising at least one grating positioned essentially perpendicular to the wafer surface and a photodetector positioned to receive light passing through the grating; and
    means coupled to the output of the photodetector for adjusting the position of the wafer surface relative to the image plane in response to variations in light intensity detected by the photodetector.

* * * * *